United States Patent [19]

O'Donnell et al.

[11] Patent Number: 4,896,287

[45] Date of Patent: Jan. 23, 1990

[54] CORDIC COMPLEX MULTIPLIER

[75] Inventors: Matthew O'Donnell; William E. Engeler, both of Schenectady, N.Y.

[73] Assignee: General Electric Company, Schenectady, N.Y.

[21] Appl. No.: 200,491

[22] Filed: May 31, 1988

[51] Int. Cl.[4] .............................................. G06F 7/52
[52] U.S. Cl. ..................................................... 364/754
[58] Field of Search ........................ 364/754, 757, 730

[56] References Cited

U.S. PATENT DOCUMENTS

| 3,868,680 | 2/1975 | Rhodes | 364/730 X |
|---|---|---|---|
| 3,926,367 | 12/1975 | Bond et al. | 364/754 X |
| 4,231,102 | 10/1980 | Barr et al. | 364/730 X |
| 4,344,151 | 8/1982 | White | 364/754 |
| 4,354,249 | 10/1982 | King et al. | 364/754 |
| 4,680,727 | 7/1987 | White | 364/754 |
| 4,769,779 | 9/1988 | Chang et al. | 364/754 |

OTHER PUBLICATIONS

The Cordic Trigonometric Computing Technique, Volder, IRE Transactions on ELectric Computers, Sep., EC-8, pp. 330-334 (1959).

Primary Examiner—Gary V. Harkcom
Assistant Examiner—Tan V. Mai
Attorney, Agent, or Firm—Geoffrey H. Krauss; James C. Davis, Jr.; Marvin Snyder

[57] ABSTRACT

A CORDIC (COordinate Rotation DIgital Computer) subsystem for multiplication of two complex digital numbers B and C, where one number is the sum of real and imaginary data portions, expressed in rectangular form (say, $C_r$ or $C_i$), and the other number can be expressed in the rectangular form or can be represented by magnitude data, expressed in polar form (say, $|B|$, $\phi$). An N-stage CORDIC portion of either recursive or pipeline sequential form, but devoid of multipliers, is used to rotate the I and Q terms of the first number through a phase angle $\phi$ of the polar-form multiplier number of the equivalent, taken from the rectangular form. The final computed data are the real and imaginary parts of the product.

20 Claims, 5 Drawing Sheets

CORDIC COMPLEX MULTIPLIER

BACKGROUND OF THE INVENTION

The present application relates to arithmetic processing means and, more particularly, to novel means, utilizing at least one COordinate Rotation DIgital Computer, for multiplying a pair of complex numbers.

In many forms of modern electronic equipment, signal processing functions of great relative complexity, such as correlation detection, discrete Fourier transformation and the like, are utilized. The basic signal processing element is a multiply-accumulate cell; for certain systems, such as ultrasonic imaging utilizing baseband signal processing and the like, fully complex signals must be multiplied. Similar complex multiplication of electronic signals can be found in many other signal processing disciplines, such as radar, sonar and the like, and especially for processing digital signals, particularly of the binary type. It is therefore highly desirable to provide digital signal means for carrying out the complex multiplication of a pair of digital signals, each representing a complex number, of the form $x+jy$ or $R, \angle\theta$.

The prior art teaches the use of the CORDIC (COordinate Rotation DIgital Computer) apparatus and technique, as initially described by JE Volder, "The CORDIC Trigonometric Computing Technique", IRE Trans. on Electronic Computers EC-8, Pp 330-334 (1959); this is a computational system wherein a rotation through an angle $\theta$ can be represented as the summation of several rotations, with each rotation being through one of a special set of angles $\alpha$, such that $$\theta = \sum_{i=1}^{n} \xi_1 \alpha_i \qquad (1)$$

where $\xi_i = +1$ or $-1$. Defining $\alpha_1 = 90°$, then $$\alpha_{n+2} = \tan^{-1}(2^{-n}), n=0, 1, 2, \qquad (2)$$

that is, the total angle is successively approximated using all of plurality n of angles $\alpha_i$, so that each finer approximation of the angle provides rectangular-coordinate results $x_{n+1}$ and $y_{n+1}$, which are related to the $x_n$ and $y_n$ rectangular-coordinate values (for the next coarsest approximation) by the pair of equations:

$$x_{n+1} = K(\theta)(x_n + \tau_i y_n/2^n) \qquad (3a)$$

$$y_{n+1} = K(\theta)(y_n - \xi_i x_n/2^n), \qquad (3b)$$

where $K(\theta)$ is a scale factor equal to $\cos(\theta)$. Since each of the $2^{-n}$ factors is in effect a division-by-two done n times, and is provided, for binary numbers, by a one-bit shift for each of the n occurrences, the complex multiplication can, except for the scale factor $K(\theta)$ multiplication (if needed), be carried out with a set of shift registers and adders. It is highly desirable to provide new apparatus, utilizing this basic CORDIC technique, for multiplying a pair of complex numbers.

BRIEF SUMMARY OF THE INVENTION

In accordance with the invention, one presently preferred CORDIC subsystem for the multiplication of two complex digital numbers $\overline{B}$ and $\overline{C}$ uses: an N-stage CORDIC rotator means of either recursive or pipeline sequential form, but devoid of multipliers, to rotate each of the real and imaginary data portions of one number, expressed in rectangular form (say $C_R$ and $C_I$) through a phase angle $\phi$ of the other number expressed in polar form (say, $|B|, \angle\phi$). Following rotation, means are provided for scalar multiplication of each of the output real or imaginary data portions of the CORDIC rotator by the magnitude data $|B|$ of the other number. The final computed data are the real and imaginary parts of the product.

In another presently preferred complex number multiplication CORDIC subsystem, each of a pair of the recursive or pipelined-sequential phase rotator means operate on the real and imaginary components of rectangular-form first and second complex numbers; the phase of each complex number is equally rotated until the first number has a zero phase angle, as determined by a sign detector, so that the phase of the output data is equal to the sum of the first and second complex number phase angles. Scalar multiplication of the product data can be used, if needed, to determine the total complex product; in many situations, such as computations of correlation statistics and the like, accumulation of only accurate phase information is necessary and relatively little precision is needed in product amplitude terms as long as the accuracy of phase information is maintained. Each of the scalar multipliers, if used, can be a shift-and-accumulate section.

Accordingly, it is an object of the present invention to provide novel CORDIC circuits for multiplying a pair of complex digital numbers.

This and other objects of the present invention become apparent upon a reading of the following detailed description, when considered in conjunction with the drawings.

DETAILED DESCRIPTION OF THE INVENTION

Figure 1:
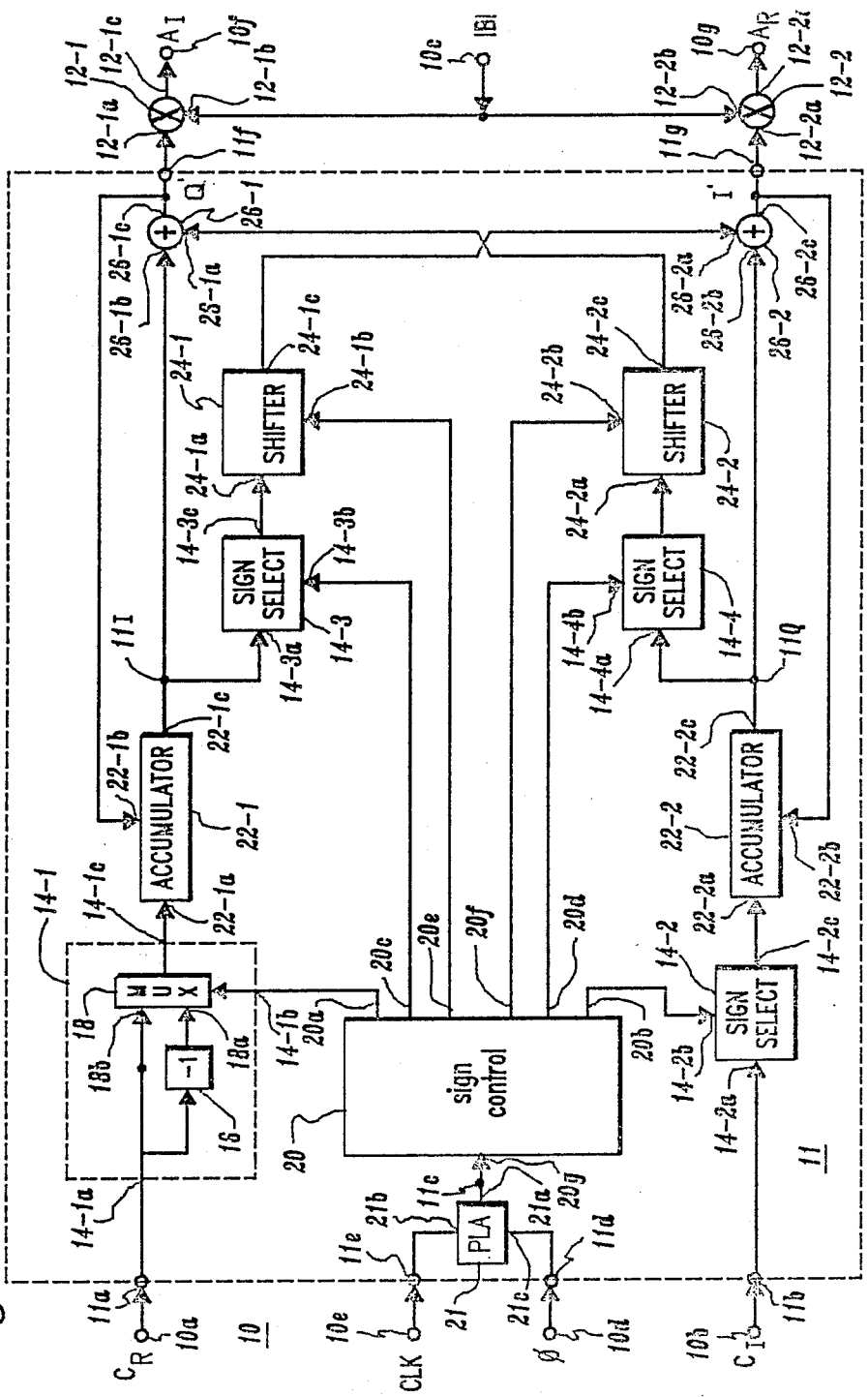
FIG. 1 is a schematic block diagram of a first form of complex digital multiplier in accordance with principles of the present invention.

Referring initially to FIG. 1, one presently preferred embodiment of a complex digital CORDIC multiplier 10 utilizes a CORDIC digital multiplier means 11 and a pair of scalar digital multiplication means 12. A first complex number C is introduced in its rectangular-coordinate form, with a P-bit real-axis component $C_R$ data word, at input 10a, connected to a first, or I, input 11a of the CORDIC multiplier, and a P-bit imaginary-axis component $C_I$ data word at a second input 10b, connected to a second, or Q, input 11b of the multiplier.

Each of a pair of scalar multiplication means 12, if used, will have a first data input 12-1a or 12-2a receiving data respectively from the imaginary-axis data Q' output 11f of the CORDIC means or the real-axis data I' output 11g. Each of means 12 can be a shift register and accumulator set, in manner well known to the digital data computation arts; because reduced amplitude accuracy may be acceptable for certain computational tasks, the components of means 12 may be of low accuracy, if present at all. The other complex number $\bar{B}$ is introduced in polar-coordinate form, with a P-bit data word for a magnitude $|B|$ component at input 10c, connected to the second inputs 12-1b and 12-2b of both scalar data multiplier means, and with an angle $\phi$ component data word at an input 10d. A periodic clock CLK signal is provided at another input 10c. The scalar-multiplied real and imaginary components of the $\bar{C}$ vector input are thus provided as the digital data at respective first and second scalar multiplication means outputs 12-1c and 12-2c. The complex multiplier output provides separate real-axis and imaginary-axis rectangular form terms $A_R$ and $\bar{A}_I$, respectively, of the complex product A, at respective output terminals 10g and 10f.

Figure 2:
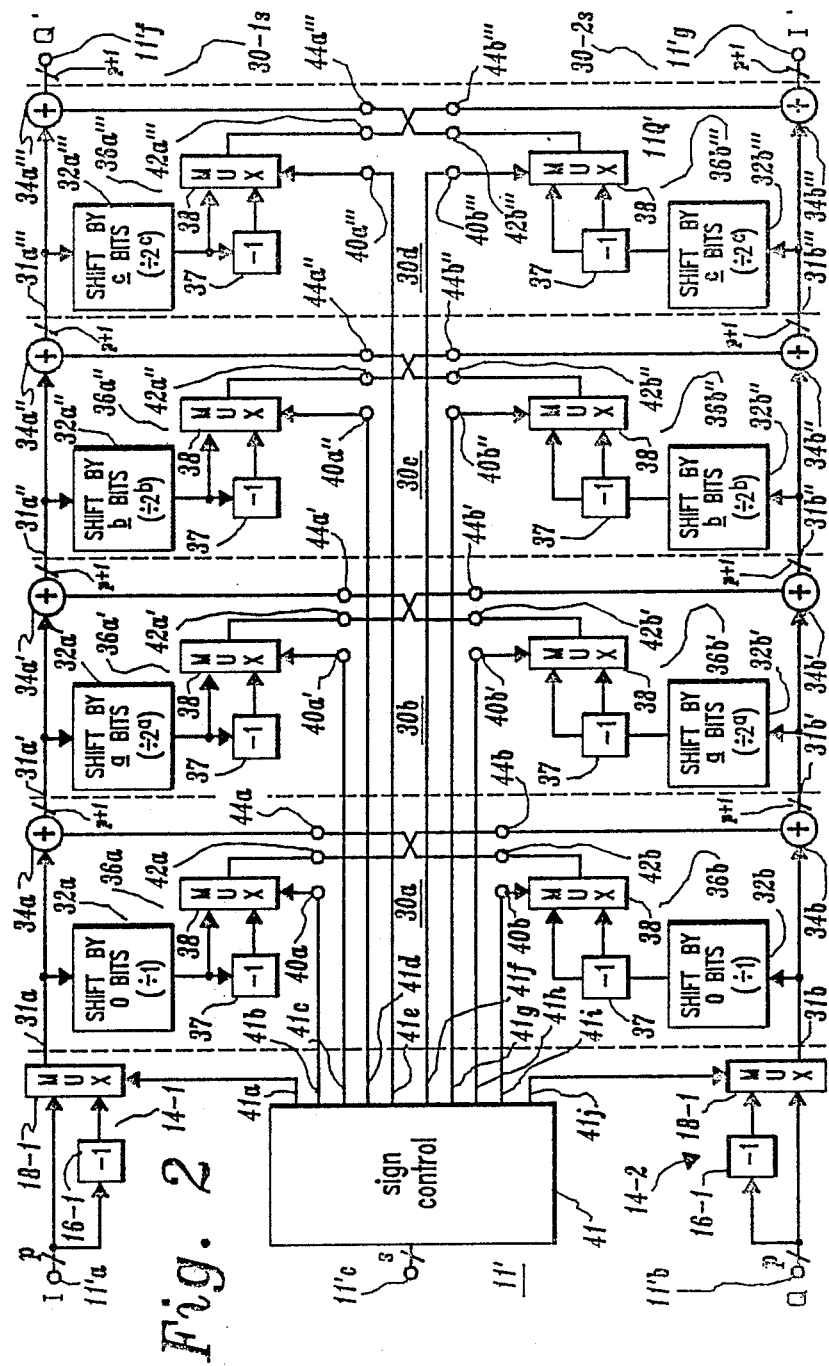
FIG. 2 is a schematic block diagram of an alternative, presently preferred embodiment for a sequential, or pipelined, CORDIC means for use in place of the recursive CORDIC means shown in the complex multiplier of FIG. 1.

In accordance with another aspect of the present invention, the CORDIC digital data multiplier means 11 is either a recursive multiplier, as shown here in FIG. 1, or a pipeline (sequential) multiplier, as will be discussed with respect to FIG. 2. Each of the real-axis I data word or the imaginary-axis Q data word respectively input to means 11 appear at the input 14-1a or 14-2a, respectively, of a first or second sign select means 14-1 or 14-2. The sign, but not the magnitude, of the input data is either unaffected or inverted (effectively causing a multiplication by $-1$), dependent upon the state of a sign-select binary control signal at a sign select input 14-1b or 14-2b, respectively. The sign selected digital data, determining if a first rotation is by $+90°$ or by $-90°$, appears at the output 14-1c or 14-2c, respectively, of sign means 14-1 or 14-2. The sign select means can be implemented, as shown in sign select means 14-1, by connecting the input 14-1a through a sign-bit inverter 16 to a first input 18a of a 2-input multiplexer MUX means 18. A second MUX means input 18b receives the original-sign digital data word from input 14-1a. Dependent upon the state of the sign-select binary signal at select input 18c of the MUX means, output 18d (and means output 14-1c) is connected to either original-polarity input 18b or inverted-polarity input 18a. The binary state of the sign-select signal is determined by a sign control means 20. If the input digital data word is represented as a two's-complement number, then the sign-inversion and multiplexing means can be replaced by a simpler structure in which each bit of the input number is connected to one input of an exclusive-OR (XOR) gate having its other input connected to the MUX select input; the output bit of each XOR gate is connected, in sequence, to an associated sequential input of an adder chain, having a carry bit to add one to the XOR output. Thus, the MUX-sign-select input signal selects either the input number or the negation of that input. In this relatively low-speed recursive-operation CORDIC multiplier 11, a plurality of sign selection signals (here, six) are required, with each different signal appearing at a different one of sign control means outputs (here, outputs 20a–20f), responsive to a sign-control data word provided from a node 11c to sign control means input 20g. This S-bit data word is advantageously provided at the output 21a of a logic means 21, such as a programmable logic array (PLA) means, responsive to the clocked advancement through a set of sign-control bits in a data word which has a binary pattern uniquely established by, and dependent upon, the angle $\phi$. Thus, one PLA means input 21b can receive, from input 11e and apparatus input 10e, the CLK pulses, while the second PLA input 21c receives (via CORDIC means input 11d and apparatus input 10d) the phase angle $\Phi$ information for the second complex quantity. Operation of the recursive embodiment is such that, upon stabilization of the data, particularly at the phase input 10d, a separate CLK pulse occurs for each of the n operations which will be summed to provide the components of the desired product. Each clock pulse thus results in the determination of whether the next smallest CORDIC angle $\alpha_i$ is to be a positive or negative contribution to the total rotational angle $\theta$, and thus causes the sign control word, at input 20g, to set all of the sign control bits at outputs 20a–20f.

The sign-selected real and imaginary P-bit data words at the output of the first stage (the $+/-90°$ select stage) appear at first and second sign-select means outputs 14-1c or 14-2c, and are provided to the $(n-1)$-recursions stage, at an input 22-1a of a first accumulator ACCUM means 22-1 or an input 22-2a of a second ACCUM means 22-2. This input data is summed with a (P+2)-bit data word at a respective second input 22-1b or 22-2b, to provide a (P+2)-bit digital data word at first or second accumulator output 22-1c or 22-2c. This output data word appears at the respective one of data nodes 11I or 11Q. The data word from node 11I appears at a first input 14-3a of a third sign-select means 14-3, receiving a sign-control signal, at an input 14-3b, from a third output 20c of the sign control means 20. The data word at node 11Q appears at a first input 14-4a of a fourth sign-select means 14-4, having a sign-select input 14-4b receiving a sign control signal from a fourth output 20d of the sign control means 20. The accumulated and sign-selected data word from the "real" channel appears at an output 14-3c for coupling to an input 24-1a of a first shifter means 24-1, while the accumulated and sign-selected data word from the "imaginary" channel appears at an output 14-4c and is coupled to an input 24-2a of a second shifter means 24-2. Each shifter means 24 has a shift control input, e.g. input 24-1b or 24-2b, respectively receiving a shift control pulse from a respective fifth or sixth output 20e or 20f of the sign control means 20. Responsive to each pulse at one of shift control inputs 24-1b or 24-2b, the data word in the shifter 24-1 or 24-2 is rotated, or shifted, one binary place to the right and the one-bit-shifted data appears at a first shifter means output 24-1c or a second barrel shifter means output 24-2c, for cross-coupling to a first input 26-2a or 26-1a, respectively, of a second digital adder means 26-2 or a first digital adder means 26-1, respectively. A remaining input 26-2b or 26-1b, respectively, of these adder means receive the digital data word from node 11Q or 11I, respectively. The word of summed data at a first summer means output 26-1c is a (p+2)-bit data word Q' provided to a first output 11-f of the CORDIC multiplier means, and then to the multiplier output 10f, while the digital data word at a second summer means output 26-2c is another (p+2)-bit signal I' provided to CORDIC means output 11g and multiplier means output 10g. The Q' data signal is returned to accumulator input 22-1b, while the I' data is returned to accumulator input 22-2b.

In operation, equations (3a) and (3b) can be rewritten, as $$I' = K(\theta)(I + \xi_i Q/2^n) \quad (4a)$$

$$Q' = K(\theta)(Q - \xi_i I/2^n) \quad (4b)$$

The common scale factor $K(\theta) = \cos\theta$ can be ignored, as previously noted, as it will have a fixed value which is dependent upon the number n of iterations selected for a desired computational accuracy. The input rotational angle $\phi$, which is any arbitrary angle, is initially decomposed into a set of rotations about angles $\alpha_i$, which satisfy equations 3a and 3b. Even though the scale factor is different for each rotation, the magnitude of the scale factor is independent of the rotational sign, so that, for a fixed number of rotations using the same magnitude of rotation but different signs at each stage, the overall scale factor is independent of the total angle of rotation and the scale factor can either be ignored or added at the end of the multiple rotation sequence. This is important for applications where the phase of the complex product is the important data (and especially important when the second quantity B magnitude is unity, allowing removal of scalar multipliers 12, so that no multipliers are needed). Illustratively, a n=8 stage rotation can be implemented with accuracy to ±0.6°, utilizing the sign selection information of Table 1.

N-stage rotation requires a first (90°) pulse, from a first clock cycle, and then (N−1) additional clock cycles to perform a rotation accurate to 0.9°. Similarly, a N=7 stage rotation requires a first pulse and six additional clock cycles to perform a rotation accurate to 1.8°, while a N=6 stage rotation needs an initial pulse and five clock cycles to rotate with an accuracy of 3.6°, and a five-stage procedure requires the initial pulse plus four clock cycles to rotate to an accuracy of 7.1°. Utilizing an input data rate of 5 MHz., the associated minimum clock frequency F is given by the formula $F = (N-1) \cdot D$, where D is the input data rate. It will be seen that these frequencies and data rates are commensurate with most types of semiconductor integrated circuit implementation in use today.

The adders and accumulators must have a bit density deep enough to accommodate a rotation from 45° to 0°, and must also take into account the scale factor for each stage rotation, which scale factor asymptomatically approaches a value of 1.65. We have found that if the adders and accumulators are designed to be two bits deeper than the bit density of the input data, there will be sufficient room to accommodate both factors. Thus, if the input signals are 7-bit data words (e.g. P=7), then (P+2)=9-bit-deep adders, accumulators and shifters are utilized.

This complex multiplier 10, which has been integrated as a CMOS silicon circuit having an area of 0.9

TABLE 1

| | | Signs to be Selected for n = 8 Stages of Rotation | | | | | | | |
|---|---|---|---|---|---|---|---|---|---|
| DESIRED ANGLE | ACTUAL ANGLE | n = 1 90° | n = 2 45° | n = 3 26.56° | n = 4 14.04° | n = 5 7.13° | n = 6 3.58° | n = 7 1.79° | n = 8 0.90° |
| 0 | 0 | + | − | − | − | − | + | − | + |
| 11.25 | 10.65 | + | − | − | − | + | − | + | + |
| 22.50 | 22.65 | + | − | − | + | − | − | + | − |
| 33.75 | 33.30 | + | − | − | + | + | − | − | − |
| 45.00 | 44.10 | + | − | + | − | − | − | − | − |
| 56.25 | 56.65 | + | − | + | − | − | + | + | + |
| 67.00 | 67.30 | + | − | + | − | + | + | − | + |
| 78.75 | 79.35 | + | − | + | + | − | + | − | − |
| 90.00 | 90.00 | + | − | + | + | + | − | + | − |
| 101.25 | 100.65 | + | + | − | − | + | − | + | + |
| 112.50 | 112.65 | + | + | − | + | − | − | + | − |
| 123.75 | 123.35 | + | + | − | + | + | − | − | − |
| 135.00 | 134.10 | + | + | + | − | − | − | − | − |
| 146.25 | 146.65 | + | + | + | − | − | + | + | + |
| 157.50 | 157.35 | + | + | + | − | + | + | − | + |
| 168.75 | 169.35 | + | + | + | + | − | + | − | − |
| 180.00 | 180.00 | + | + | + | + | + | − | + | − |

Negative angles (0 to −180°) require inversion of all bits of the data word.

The input $C_R$ and $C_I$ data words are sign modified, to perform a ±90° rotation, and the sign-modified I or Q data is each individually loaded into an initially-cleared associated accumulator means 22, responsive to a first clock pulse (i.e. with a clock pulse number C=1) of a cycle N=8 clock pulses. This first-pass accumulated data appears at nodes 11I and 11Q, respectively, and at the associated summer means input 26-1b and 26-2b, respectively.

The first stage, represented by sign-select means 14-1 or 14-2, represents the ±90° rotation of the term $\alpha_1$. The second stage, commencing with accumulators 22 in both the real- and imaginary-axis channels, is utilized recursively for (N−1) operations, and therefore requires only N−1 CLK pulses. On successive clock cycles, for C=2, 3, . . . , 8, the contents of each accumulator are summed with the contents of the other accumulator, following sign modification and truncation in the sign-select means 14-3 and 14-4 and the shifter means 24-1 or 24-2, of the opposite channel. Thus, a mm. by 1.2 mm., can be utilized, as one example, for a M-tap base-band correlation detector having a governing equation:

$$\vec{A}_i = \sum_{j=-M/2}^{(M/2)-1} \vec{B}_j \vec{C^*}_{i+j} \quad (5)$$

where $\vec{A}$ is the complex output data of the detector, $\vec{B}$ is the complex reference data input and $\vec{C}$ is the complex detector data input. Similarly, the governing equation for a M-point discrete Fourier transformation is $$\vec{A}_k = \sum_{j=0}^{M-1} \vec{a}_j \vec{W}_M^{kj} \quad (6)$$

where $\vec{A}$ is the complex discrete Fourier transform of the complex sequence $\vec{a}$, and $\vec{W}_M$ is the M-th complex root of unity. Thus, it will be seen that the basic processing step in both correlation and discrete Fourier transformation is a complex multiply-accumulate. For the correlation example, the complexly multiplied outputs are of the form $$A_R = B_R C_R + B_I C_I \qquad (7)$$

where the subscript R signifies the real component and the subscript I signifies the imaginary component, and $$A_I = B_R C_I - B_I C_R. \qquad (8)$$

This complex multiplication can be rewritten as $$A_R = |B|(C_R \cos\phi - C_I \sin\phi) \qquad (9)$$

and $$A_I = |B|(C_R \sin\phi + C_I \cos\phi) \qquad (10)$$

If the coefficients of the reference B quantity are loaded as magnitude $|B|$ and phase $\phi$ data, rather than as real and imaginary part data, it will be seen that the circuit of FIG. 1 can be used as a complex multiplier for the multiply-accumulate cell. Thus, as the CORDIC for each multiply-accumulate cell contains the same number of stages, the scale factor $K(\theta)$ is the same for all cells and the scale factor can be explicitly taken into account either by altering the individual magnitude coefficients or by scaling the final output of the correlator. It will be seen that the structure of FIG. 1 is much more efficient than a conventional complex multiply cell, as two multipliers and two adders can be eliminated by use of the CORDIC processor 10. For the complex correlation example, the circuit of FIG. 1 can be further simplified for efficient computation of the discrete Fourier transform (DFT), in that the complex multiply in a DFT algorithm has unity magnitude, i.e. $|W_M| = 1$. Therefore, both multipliers 12 can be removed and a greatly simplified circuit results.

For even faster computations, the recursive second portion of the CORDIC multiplier, or phase rotator, means 11 can be replaced by a sequential, or pipeline, architecture. One presently preferred pipeline CORDIC multiplier 11' is shown in FIG. 2. The P-bit real-axis I data word is presented at input 11'a, and the P-bit imaginary-axis Q data word is presented at input 11'b. Both of the I or Q data words is separately operated on by an associated one of sign selection means 14-1 or 14-2, in a first section which performs a $\pm 90°$ rotation. In a second section, a plurality $(N-1)$ of identical stages 30 are utilized; in this illustrated $N=5$ embodiment, four stages 30a–30d are used. Each stage 30 has identical real-axis and imaginary-axis portions 30-1 and 30-2, respectively. In each portion, the data word at an input 31a or 31b is coupled both to an input of a shift means 32a or 32b, and to an input of an adder means 34a or 34b. The output of bit shifter means 32 is coupled to the input of a sign selector means 36a or 36b, each comprised of an inverter $(-1)$ means 37 and a multiplexer MUX means 38. The sign-select control signal, at an associated one of inputs 40a, 40b, ..., 40a''', 40b''', is provided at an associated output 41b–41i of a sign control means 41. The sign-control means receives a S-bit-wide sign control data word at a sign control input 11'c. This data word determines the binary state of each signal at a MUX means output 42a, 42b, ..., 42a''' or 42b'''. The output 42a or 42b is cross-connected to the associated second input 44b or 44a of the summer means 34 for the opposite channel portion of the same stage, e.g. the second input 44a for the real-axis portion adder means of the first stage 30a is cross-connected to the imaginary-axis channel output 42b, while the imaginary-axis channel adder means second input 44b is connected to the real-axis channel output 42a, and so forth. The shifter means 32k in each k-th stage 30k, where $1 \leq k \leq (N-1)$, contains one more shift bit then the shifter means in the previous (k−1)-th stage 30(k−1); the k-th stage 30k uses a (k−1)-bit shift means 32k. Thus, the shifter means 32a and 32b in the first stage shift by zero bits, for a divide-by-1 function, and can effectively be replaced by a through-connection, i.e. are not utilized. The bit shifters 32a' and 32b' in the second stage 30b divide by one additional bit, so that a = 1 and a division-by-two function appears. Similarly, in the third stage 30c the shift is by b = 2 bits, for a divide-by-four function, and the fourth stage 30d shifter means 32a''' shifts by c = 3 bits, for a divide-by-8 function. It will be seen that this pipelined CORDIC architecture requires only the first stage pulse and is of a speed essentially set by the logic delays through the N total stages; this is almost always much more rapid a calculation than the results from a recursive CORDIC embodiment.

Figure 3:
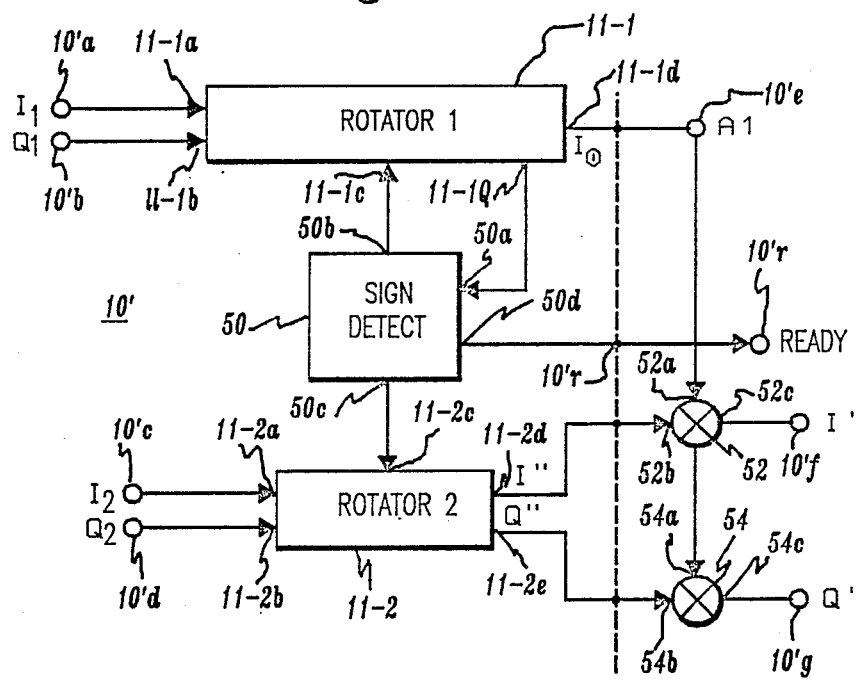
FIG. 3 is a block diagram of another form of complex digital multiplier in accordance with principles of the present invention.
Figures 3A, 3B:
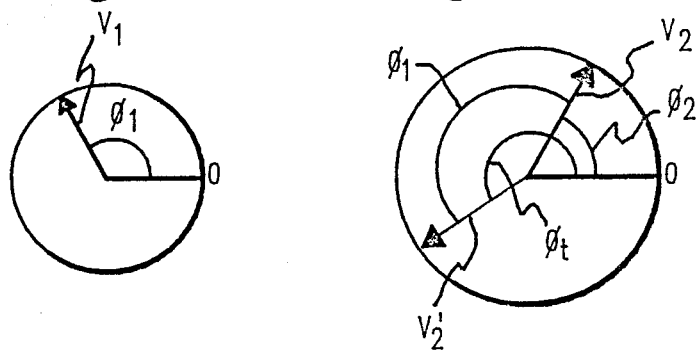
FIGS. 3a and 3b are vector diagrams illustrating concepts useful in appreciating operation of the complex digital multiplier form of FIG. 3.

Referring now to FIG. 3, either, or both, of the recursive or pipeline CORDIC rotator 11 or 11' can be utilized in another embodiment of a multiplier subsystem 10' for producing the product of two complex numbers. If the first complex number $\vec{N1}$ is represented as $|V_1|$, $\phi_1 = |\vec{A_1}|e^{i\phi_1}$, (FIG. 3a) and the second complex number $\vec{N2}$ is represented as $|V_2|$, $\phi_2 = |A_2|e^{i\phi_2}$(FIG. 3b), then the product $\vec{P}$ of $(I_1+iQ_1)\cdot(I_2+iQ_2)$ is $\vec{P} = |A_1||A_2|e^{i(\phi_1+\phi_2)}$. It will be seen that the first complex number, as a vector $\vec{V}_1$, can be rotated through its phase angle $\phi_1$ to remove its imaginary part, and end with only a real remainder, i.e. with $I_1' = |V_1| = |A_1|$ and $Q_1' = 0$. In so doing, phase angle $\phi_1$ is analyzed to determine the sign of rotation to be imparted to the second complex number vector $\vec{V}_2$, so that the resulting rotated second vector $\vec{V}_2'$ is equal to $|A_2|e^{i(\phi_1+\phi_2)}$ and needs only to be scalar multiplied by $|A_1|$, now available as the $I_1'$ quantity, to provide the final complex product P. This fully complex multiplier 10' receives both the first complex number $\vec{N1}$ and the second complex number $\vec{N2}$ as input data representing the respective real or in-phase parts $I_1$ or $I_2$ and the respective imaginary, or quadrature-phase parts $Q_1$ or $Q_2$. Thus, the first complex number $\vec{N1}$ as an in-phase part data word $I_1$ appearing at a first input 10'a and a quadrature-phase part data word $Q_1$ appearing at another input 10'b. The second complex number $\vec{N2}$ has a real part data word $I_2$ appearing at an input 10'c and an imaginary part data word $Q_2$ appearing at an input 10'd. The real $I_1$ and imaginary $Q_1$ part data words of the first complex number are input to a first CORDIC rotator means 11-1, while the real $I_2$ and imaginary $Q_2$ part data words of the second complex number are input to a second CORDIC rotator means 11-2. The rotational angle of both rotators is at least partially controlled by a signal at a rotate-control input 11-1c or 11-2c (which input corresponds to the sign-control input 11c in the rotators of FIGS. 1 and 2). The signal at node 11-1Q (which node corresponds to node 11Q in FIG. 1 or node 11Q-1 in FIG. 2) is applied to an input 50a of a sign control means 50 and, determines the state of a binary signal at each of outputs 50b and 50c (and, therefore, at connected rotate-control inputs 11-1c and 11-2c) by comparison of the node 11-1Q data to a fixed data pattern representing a zero residual phase angle in the first rotator means 11-1. That is, the phase angle $\phi_1$ in the first rotator means is successively decremented to approximately a 0° residual phase angle, while the total phase angle $\phi_T$ in the second rotator means is incremented by the same angular rotations, so that, when $\phi_1 \simeq 0°$, $\phi_T \simeq (\phi_1 + \phi_2)$ and is the phase angle of the desired product $\vec{P}$. Rotation commences when the data at node 11-1Q indicates that number $\vec{N}_1$ has a quadrature-phase component, i.e. that angle $\phi_1$ is not zero degrees. Responsive to the data at input 50a, the logic state of the signals at inputs 11-1c and 11-2c are determined to cause both rotators to add or subtract the next incremental angle $\theta' = \tan^{-1}(\frac{1}{2}^n)$, for the next n, from the phase of the data word input thereto. Thus, the sign of the rotations in both rotators is determined by the sign of the "$Q_1$" remainder in the first rotator means 11-1 forcing a successive approximation towards zero degrees. In effect, first rotator 11-1, through a succession of CORDIC rotations, transforms the first complex data word $\vec{N}_1$ into a real number $A_1$, representing the magnitude of that first complex number. When the CORDIC rotation completes the prescribed number of stages, the changes in outputs 50b and 50c cease and a phase-rotation-complete READY signal is provided at an output 50d, and thence at a multiplier output 10'r. The in-phase data word at the second rotator means $I_2'$ output 11-2d and the quadrature-phase data word at the $Q_2'$ output 11-2e now respectively represent:

$$I_2' = Re|V_2'| = Re(|A_2|e^{j(\phi_1+\phi_2)}) = |A_2|\cos(\phi_T) \quad (11a)$$

and $$Q_2' = Im|V_2'| = Im(|A_2|e^{j(\phi_1+\phi_2)}) = |A_2|\sin(\phi_T). \quad (11b)$$

The $|A_1|$ data word, from first rotator I output 11-1d, now appears, via node 10'e, at the inputs 52a and 54a of first and second scalar multiplier means 52 and 54. The $I_2'$ data words is coupled to a second input 52b of the first multiplier means 52, while the $Q_2'$ data word is coupled to a second input of the second multiplier means 54. The I" data word, at first multiplier output 52c, appears at complex CORDIC multiplier output 10'f, and is the data for Re (P) = $|A_1||A_2|\cos(\phi_T)$, while the Q" data word, at second multiplier output 54c, appears at complex CORDIC multiplier output 50'g, and is the data for Im(P) = $|A_1||A_2|\sin(\phi_T)$.

Figure 4A:
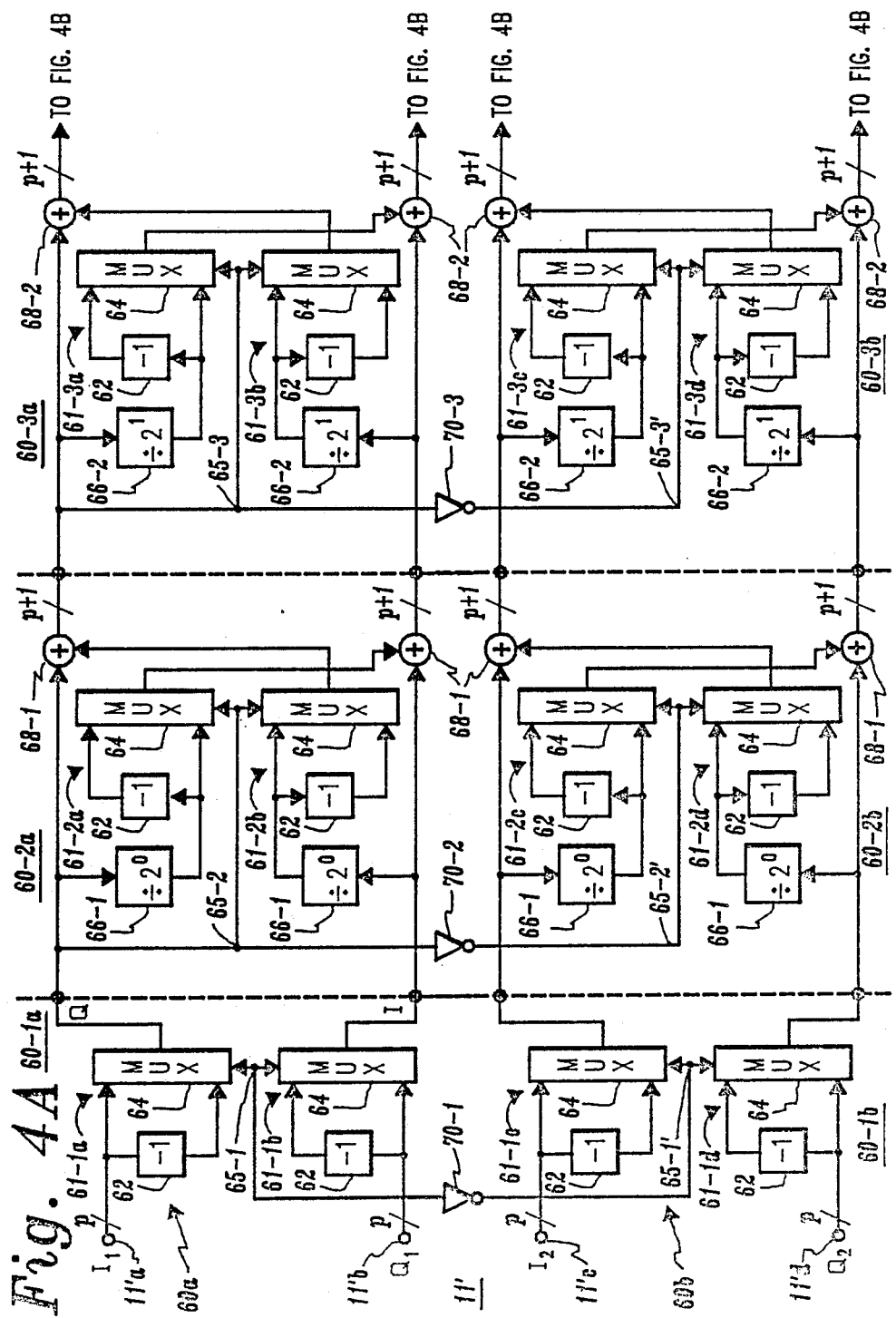
FIG. 4 comprised of FIGS. 4A and 4B represent a schematic block diagram of the presently preferred embodiment of a sequential, or pipelined, means for performing the complex multiplication in the apparatus of FIG. 3.
Figure 4B:
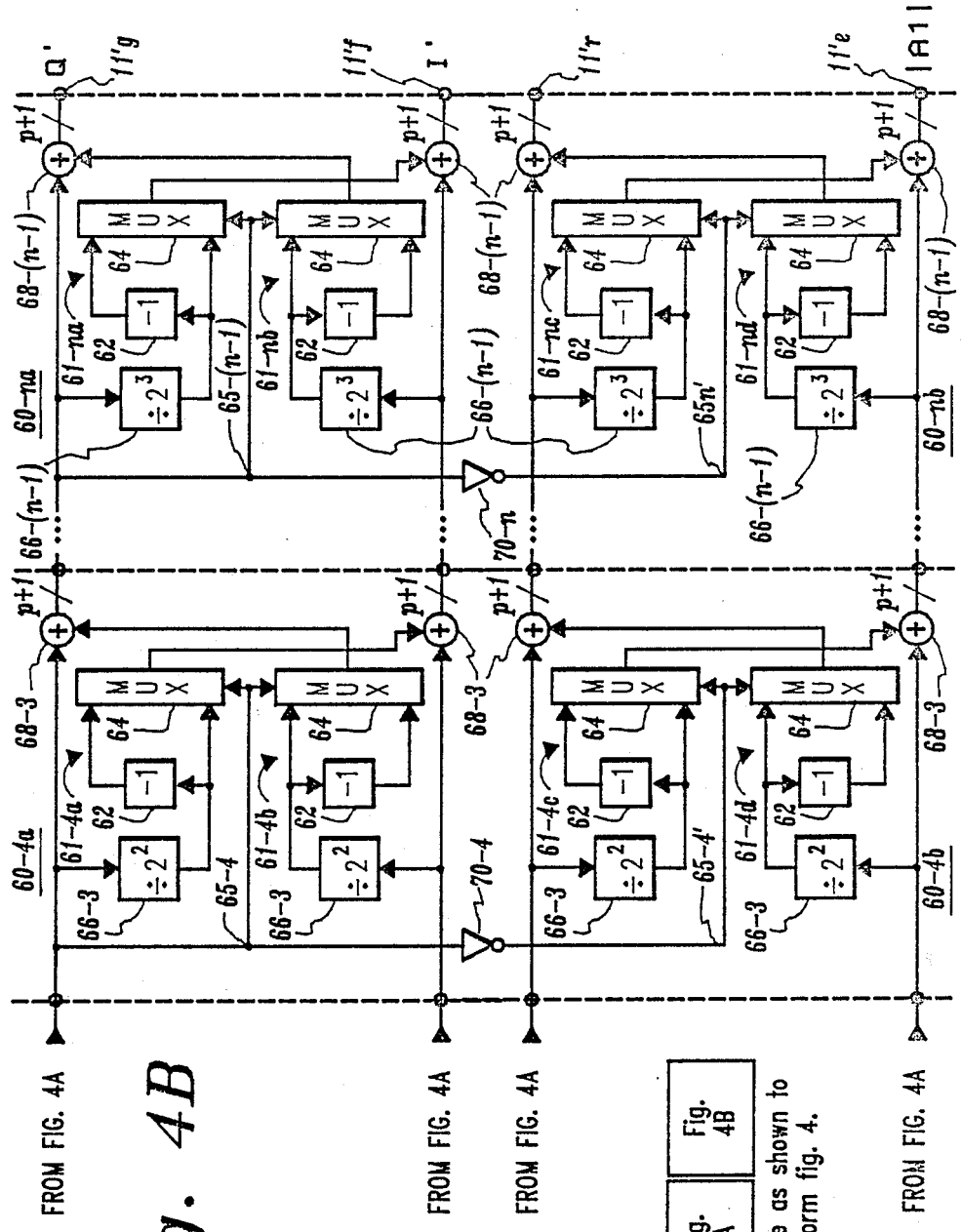

Referring now to FIG. 4, the rotators 11-1 and 11-2 and sign control means 50 of FIG. 3 can be realized by a fast-computing pipelined multiplier subassembly 11'. A first N-stage sequential CORDIC multiplier 60a has a first stage 60-1a, receiving the real-axis $I_1$ data, from an input 11'a, at sign-select means 61-1a (comprised of an inverter 62 and a MUX means 64) and the imaginary-axis $Q_1$ data, from an input 11b, at another sign-select means 61-1b, with the sign-select bit (for this first stage only) being taken from the $Q_1$ input data. The first multiplier 60a then has a plurality (N−1) of substantially-identical stages 60-2a through 60-na, each with identical subsections for the I and Q portions, with each subsection having a sign-select means 61-2a through 61-na or 61-2b through 61-nb, a divide-by-$2^{(I-1)}$ means 66-1 to 66-(n−1), where $1 \leq I \leq N$ and I is the stage number and an adder means 68-1 to 68-(n−1). A second N-stage sequential CORDIC multiplier 60b has the same arrangement of first stage 60-1b and (N−1) latter identical stages 60-2b to 60-nb. The sign-bit (at the MUX sign-select control inputs 65-1 to 65-n of each of the first multiplier 60a stages) is inverted by an associated one of a plurality N of logic inverters 70-1 through 70-n, so that the sign bit of the Q output of any stage of the first CORDIC multiplier 60a determines the rotational sign of the next stage of BOTH multipliers 60a and 60b. Thus, the sign bit is inverted between the two pipeline CORDIC structures 60a and 60b so that the first multiplier 60a rotates the first input data ($I_1$ and $Q_1$) to a phase $\phi_T$ equal to ($\phi_1 + \phi_2$) at outputs I' and Q' and the second multiplier 60b rotates the second input data to zero phase, providing the $|A_1|$ magnitude at real output 11'e (and a substantially zero-magnitude remainder at a residual output 11'r, which Q output is a measure of the dual rotator error). The I' and Q' data can be scalar-multiplied by the $|A_1|$ data, by means 52 and 54 as in the embodiment of FIG. 3, if such multiplication is required.

Each of these complex multiplier structures has a number of advantages over more conventional complex multipliers. First, and most important, phase and amplitude accuracy can be decoupled; amplitude truncation will not affect the phase accuracy of the final answer, and vice versa. Second, these complex multiplier embodiments 10' (with a pair of CORDIC units 11-1 and 11-2 or with a single unit 11') give intermediate stage results which may be useful for certain applications. For example, if one input to these structures is simply the complex conjugate of the other input, then these apparatus will simultaneously present the amplitude of the input signal at output 10'e or 10"e and the signal power of the input signal at output 10'f or 10"f. Consequently, this embodiment can be used as a simultaneous magnitude and power detector. The structures of FIGS. 3 and 4 represents a much more flexible approach to complex multiplication than many other multiplier configurations.

While several presently preferred variations of our novel complex CORDIC multiplier, and of CORDIC rotators for use therein, have been described by way of example herein, many modifications and variations will now become apparent to those skilled in the art. It is our intent, therefore, to be limited only by the scope of the appending claims and not by way of explanation of the preferred embodiments described herein.

What we claim is:

1. A recursive CORDIC rotator, comprising:
   means for receiving digital data words representing each of the real $C_R$ part and the imaginary $C_I$ part of a first complex number C;
   a first portion including means for rotating each one of the first complex number real $C_R$ part and imaginary $C_I$ part by a first angular increment $\alpha_1$ of a selected one of +90° and −90° to form an associated one of digital data words I and Q;
   a recursion portion including means for rotationally modifying each of the I and Q digital data words, received from the first portion, recursively through each selected one of positive and negative incremental angles $\alpha_1$, for $2 \leq i \leq N$, where N is a positive integer greater than 2, and each incremental angle $\alpha_i$ not only less than angle $\alpha_1$ but also greater than a next incremental angle $\alpha_{i+1}$;
   means for receiving a digital data word representing an angular rotation $\phi$ portion of a second complex number B, expressed in amplitude/rotation angle form, and for controlling the signs of the angle $\alpha_1$ in the first portion and all of the incremental angles $\alpha_1$ in the recursion portion to successively approximate the second complex number rotation angle $\phi$; and means for providing the first and second parts, after rotational modification through all N angles, respectively as a rotated imaginary-part output digital data word $A_I$ substantially equal to $(B_R C_I - B_I C_R)$, where $B_R$ and $B_I$ are respective real and imaginary parts of the second complex number B, and a rotated real-part output digital data word $A_R$ substantially equal to $(B_R C_R + B_I C_I)$.

2. The rotator of claim 1, wherein the first increment $\alpha_1$ rotating means includes means for selecting one of the same sign and the reversed sign for each respective one of the first complex number real and imaginary parts, responsive to a respective one of first and second sign-control signals from said sign controlling means.

3. The rotator of claim 2, wherein each incremental angle $\alpha_i = \tan^{-1}(2^{-n})$, for $n = i - 2$.

4. The rotator of claim 3, wherein i is less than 8.

5. The rotator of claim 3, wherein the recursion portion rotating means includes: first means for accumulating the I digital data word from the first portion and each sequential one of (N−1) first sequentially-shifted digital data words; second means for accumulating the Q digital data word from the first portion and each sequential one of (N−1) second sequentially-shifted digital data words; first sign-select means for selectively reversing, responsive to a first sign-select means sign-control signal from said sign-controlling means, the sign of the digital data word then provided by said first accumulator means; second sign-select means for selectively reversing, responsive to a second sign-select means sign-control signal from said sign-controlling means, the sign of the digital data word then provided by said second accumulator means; first means for shifting the bits of the digital data word from said first sign-select means by one bit in a predetermined direction for each occurrence of a first shifting means control signal from said sign-controlling means; second means for shifting the bits of the digital data word from said second sign-select means by one bit in a predetermined direction for each occurrence of a second shifting means control signal from said sign-controlling means; first adder means for adding the digital data words from the first accumulator means and the second shifting means to provide each sequential one of the (N−1) first sequentially-shifted digital data words both to the first accumulator means and as the $A_I$ output digital data word; and second adder means for adding the digital data words from the second accumulator means and the first shifting means to provide each sequential one of the (N−1) second sequentially-shifted digital data words both to the second accumulator means and as the $A_R$ output digital data word; said sign-control means having additional outputs at which said first and second sign-control means and first and second shifting means sign-control signals are all provided for each of the (N−1) recursions, responsive to the received rotation angle $\phi$ data.

6. A sequential CORDIC rotator, comprising:

means for receiving digital data words representing each of the real I and imaginary Q parts of a first complex number;

a first portion including stage means for separately rotating each one of the first and second complex number real and imaginary parts by a first angular increment $\alpha_1$ of a selected one of $+90°$ and $-90°$;

a second portion including a plurality (N−1) of stage means, where N is a positive integer greater than 2, each for rotationally modifying a pair of input real and imaginary part digital data words through one selected one of a positive and negative incremental angles $\alpha_i$, for $2 \leq i \leq N$, with each i-th stage means incremental angle $\alpha_i$ not only less than angle $\alpha_1$ but also greater than a next stage incremental angle $\alpha_{i+1}$, and with the pair of input digital data words to the second portion first stage means being received from the first portion and the pair of input digital data words for any other stage means of the second portion being received from an immediately-previous second portion stage means;

means for receiving a digital data word representing an angular rotation $\phi$ portion of a second complex number expressed in amplitude/rotation-angle form, and controlling the signs of the angle $\alpha_1$ in the first portion and all of the incremental angles $\alpha_1$ in the plurality of stage means to approximate the second complex number rotation angle $\phi$; and means for providing the first and second parts, after rotational modification through all N angles, respectively as a rotated imaginary-part output digital data word and a rotated real-part output digital data word.

7. The rotator of claim 6, wherein the first increment $\alpha_1$ rotating means includes means for selecting one of the same sign and the reversed sign for the selected one of the first and second complex number real and imaginary parts, responsive to a first-increment sign-control signal from said sign controlling means.

8. The rotator of claim 7, wherein each incremental angle $\alpha_i = \tan^{-1}(2^{-n})$, for $n = i - 2$.

9. The rotator of claim 8, wherein i is less than 8.

10. The rotator of claim 8, wherein each stage means includes: means for receiving both a real part digital data word and an imaginary part digital data word input to that stage means; first means for shifting the bits of the real part input digital data word means by n bits in a predetermined direction; second means for shifting the bits of the imaginary part input digital data word by n bits in the predetermined direction; first sign-select means for selectively reversing, responsive to a first sign-select means control signal from said sign-controlling means, the sign of the shifted digital data word from the first shifting means; second sign-select means for selectively reversing, responsive to a second sign-select means control signal from said sign-controlling means, the sign of the shifted digital data word from the second shifting means; first adder means for adding the real part input digital data word and the digital data word from the second sign-select means to provide a real part output digital data word from that stage means; and a second adder means for adding the imaginary part input digital data word and the digital data word from the first sign-select means to provide an imaginary part output digital data word from that stage means; said sign-control means having additional outputs at which are provided, responsive to the received rotation angle $\phi$ data, all first and second sign-control means control signals for all (N−1) stage means.

11. Apparatus for providing output digital data which is the produce of a first complex number $\widetilde{C}$, represented as a real-part digital data word $C_R$ and an imaginary-part digital data word $C_I$, and a second complex number $\vec{B}$, represented as a magnitude $|B|$ digital data word and a phase angle $\phi$ digital data word comprising:

input means, receiving at least the first complex number real-part digital data word $C_R$ and the imaginary-part digital data word $C_I$, for providing an input real-part digital data word I and an input imaginary-part digital data word O;

CORDIC means for rotationally modifying respectively the input real-part digital data word I and the input imaginary part digital data word Q responsive to the phase angle $\phi$ digital data word to respectively obtain an output digital data word Q' and an output digital data word I'; and output means receiving the respective output Q' and I' digital data words for respectively providing an imaginary part $A_I$ and a real-part $A_R$ of a digital data word for an output complex number A proportional to the product of $\vec{B}$ and $\vec{C}$.

12. The apparatus of claim 11, wherein the CORDIC means is a recursive CORDIC rotator.

13. The apparatus of claim 12, wherein the output means further comprises: means receiving the second complex number magnitude $|B|$ digital data word; and means for scalar multiplying each respective one of the real-part digital data word I' and the imaginary-part digital data word Q' by the magnitude $|B|$ digital data word to obtain the respective real-part $A_R$ and imaginary-part $A_I$ digital data words.

14. The apparatus of claim 11, wherein the CORDIC means is a sequential CORDIC rotator.

15. The apparatus of claim 14, wherein the output means further comprises means receiving the second complex number magnitude $|B|$ digital data word; and means for scalar multiplying each respective one of the real-part digital data word I' and the imaginary-part digital data word Q' by the magnitude $|B|$ digital data word to obtain the respective real-part $A_R$ and imaginary-part $A_I$ digital data words.

16. Apparatus for providing output digital data which is the product of a first complex number, represented as a real-part digital data word $I_1$, and an imaginary-part digital data word $Q_1$, and a second complex number, represented as a real-part digital data word $I_2$ and an imaginary-part digital data word $Q_2$, comprising:

first and second CORDIC means for rotationally modifying by an angle $\alpha_i$, where i is a positive integer, where $\alpha_1$ is a selected one of $\pm 90°$ and $\alpha_i$, for $2 \leq i \leq N$ and N greater than 2, is $\tan^{-1}(2^{-n})$ with $n = i - 2$, respectively an input real-part digital data word I and an input imaginary-part digital data word Q, responsive in each i-th one of N time intervals to the state of another digital data bit, to respectively obtain an output digital data word Q' and an output digital data word I'; the first CORDIC means receiving respective data words $I_1$ and $Q_1$ as respective real-part and imaginary-part data words and providing at least one output data word $I_0$ and a signal which changes sign state when the effective output angle is substantially zero; the second CORDIC means receiving respective data words $I_2$ and $Q_2$ as respective real-part and imaginary-part data words and providing respective real-part and imaginary-part output data words I'' and Q'';

means for providing in each i-th time interval said another digital data bit with a data state selected to cause both of said CORDIC means to rotationally modify the output digital data words therein until the sign-stage signal changes sign; and output means receiving the respective output I'' and Q'' digital data words for respectively providing an imaginary-part I' of the output digital data and a real-part Q' of the output digital data word.

17. The apparatus of claim 16, wherein each of the CORDIC means is a recursive CORDIC rotator.

18. The apparatus of claim 17, wherein the output means further comprises: means receiving the first CORDIC means output data word $I_0$; and means for scalar multiplying each respective one of the real-part output I'' data word and the imaginary-part output Q'' digital data word by the $I_0$ data word to obtain the respective real-part I' and imaginary-part Q' digital data words.

19. Apparatus for providing output digital data which is the product of a first complex number, represented as a real-part digital data word $I_1$ and an imaginary-part digital data word $Q_1$, and a second complex number, represented as a real-part digital data word $I_2$ and an imaginary-part digital data word $Q_2$, comprising: first and second CORDIC means for rotationally modifying by an angle $\alpha_i$, where i is a positive integer, where $\alpha_1$ is a selected one of $\pm 90°$ and $\alpha_i$, for $2 \leq i \leq N$ and N greater than 2, is $\tan^{-1}(2^{-n})$ with $n = i - 2$, respectively an input real-part digital data word I and an input imaginary-part digital data word Q, with the sign of each angle responsive to the logic state of an associated sign bit; the sign bit for each angle of the first means being the data bit then present at one of the pair of data inputs for a computing stage for that angle, to respectively obtain an output digital data word Q' and an output digital data word I';

a plurality N of means for inverting the logic state of an input bit, each i-th inverting means receiving the sign bit from the stage for the first means for the associated i-th angle and providing another sign bit to the like-numbered i-th stage of the second means;

the second means receiving the respective data words $I_2$ and $Q_2$ as respective real-part and imaginary-part data words and providing at least one output word which is the magnitude $|A_2|$ of the second complex number; and output means receiving the respective output I' and Q' digital data words for respectively providing an imaginary-part Q'' of the output digital data and a real-part I'' of the output digital data word.

20. The apparatus of claim 19, wherein the output means further comprises: means receiving the second CORDIC means output data word $|A_2|$; and means for scalar multiplying each respective one of the real-part output I'' digital data word and the imaginary-part output Q'' digital data word by the $|A_2|$ data word to obtain the respective real-part I' and imaginary-part Q' digital data words.

* * * * *